(12) United States Patent
Böger et al.

(10) Patent No.: US 10,300,678 B2
(45) Date of Patent: May 28, 2019

(54) SURFACE-COATED STEEL SHEET AND PROCESS FOR THE PRODUCTION THEREOF

(71) Applicant: ThyssenKrupp Steel Europe AG, Duisburg (DE)

(72) Inventors: Thorsten Böger, Duisburg (DE); Peter Klauke, Schwerte (DE); Anastasia Schüssler, Duisburg (DE)

(73) Assignee: THYSSENKRUPP STEEL EUROPE AG, Duisburg (DE)

( * ) Notice: Subject to any disclaimer, the term of this patent is extended or adjusted under 35 U.S.C. 154(b) by 0 days.

(21) Appl. No.: 14/650,999

(22) PCT Filed: Nov. 26, 2013

(86) PCT No.: PCT/EP2013/074669
§ 371 (c)(1),
(2) Date: Jun. 10, 2015

(87) PCT Pub. No.: WO2014/090561
PCT Pub. Date: Jun. 19, 2014

(65) Prior Publication Data
US 2015/0314567 A1    Nov. 5, 2015

(30) Foreign Application Priority Data

Dec. 11, 2012  (DE) .................. 10 2012 112 109

(51) Int. Cl.
| | | |
|---|---|---|
| B32B 3/00 | (2006.01) |
| B32B 15/01 | (2006.01) |
| C25D 3/04 | (2006.01) |
| C25D 3/38 | (2006.01) |
| C25D 3/56 | (2006.01) |
| C25D 3/58 | (2006.01) |
| C23C 16/06 | (2006.01) |
| C23C 2/04 | (2006.01) |

(Continued)

(52) U.S. Cl.
CPC .......... *B32B 15/012* (2013.01); *B32B 15/013* (2013.01); *C23C 2/04* (2013.01);
(Continued)

(58) Field of Classification Search
None
See application file for complete search history.

(56) References Cited

U.S. PATENT DOCUMENTS 4,298,661 A * 11/1981 Ikeno ...................... C23C 22/24
                                                                      428/623
4,793,870 A * 12/1988 Krauss ..................... C21D 9/52
                                                                      148/566

(Continued)

FOREIGN PATENT DOCUMENTS

| CN | 101443132 A | 5/2009 |
| DE | 102006047060 A1 | 11/2007 |

(Continued)

*Primary Examiner* — Seth Dumbris
(74) *Attorney, Agent, or Firm* — The Webb Law Firm

(57) ABSTRACT

A surface-coated steel sheet of stainless steel is disclosed and has a coating which is made up of at least one metallic corrosion protection layer (1.1) and at least one further layer (1.2) applied to the metallic corrosion protection layer. For such a steel sheet to offer, without a color-imparting organic surface coating, a high-quality impression in terms of aesthetic effect and additionally, have a very high UV resistance, the at least one further layer (1.2) may be a metallic layer or be formed from a metallic layer, where the metallic layer (1.2) is based on nonrusting stainless steel, a chromium- and/or nickel-containing alloy, copper and/or a copper alloy. The at least one further metallic layer (1.2) can optionally be provided with a transparent layer (1.3). Furthermore, a process for producing such a surface-coated steel sheet is described.

6 Claims, 1 Drawing Sheet

(51) Int. Cl.
*C23C 2/06* (2006.01)
*C23C 2/12* (2006.01)
*C23C 2/26* (2006.01)
*C23C 14/02* (2006.01)
*C23C 28/02* (2006.01)
*C23C 14/16* (2006.01)
*C23C 14/56* (2006.01)
*C25D 7/06* (2006.01)

(52) U.S. Cl.
CPC .................. *C23C 2/06* (2013.01); *C23C 2/12* (2013.01); *C23C 2/26* (2013.01); *C23C 14/025* (2013.01); *C23C 14/028* (2013.01); *C23C 14/165* (2013.01); *C23C 14/562* (2013.01); *C23C 16/06* (2013.01); *C23C 28/021* (2013.01); *C23C 28/025* (2013.01); *C25D 3/04* (2013.01); *C25D 3/38* (2013.01); *C25D 3/56* (2013.01); *C25D 3/562* (2013.01); *C25D 3/58* (2013.01); *C25D 7/0614* (2013.01); *Y10T 428/12472* (2015.01); *Y10T 428/12757* (2015.01); *Y10T 428/12778* (2015.01)

(56) References Cited

U.S. PATENT DOCUMENTS

| | | | |
|---|---|---|---|
| 4,908,280 A * | 3/1990 | Omura | C23C 18/36 148/518 |
| 5,618,634 A * | 4/1997 | Hosoda | C23C 28/3225 205/104 |
| 6,360,423 B1 | 3/2002 | Groll | |
| 2003/0049485 A1 * | 3/2003 | Brupbacher | B05D 5/083 428/615 |
| 2004/0197594 A1 * | 10/2004 | Suzuki | C23C 22/83 428/626 |
| 2006/0265926 A1 * | 11/2006 | Sietsema | F41A 21/04 42/76.02 |
| 2009/0047540 A1 * | 2/2009 | Ilk | C23C 2/26 428/609 |
| 2009/0181262 A1 * | 7/2009 | Isaksson | B44C 1/00 428/626 |
| 2010/0003538 A1 | 1/2010 | Nikolov et al. | |
| 2012/0118437 A1 * | 5/2012 | Wang | B21D 22/022 148/512 |
| 2012/0219823 A1 * | 8/2012 | Myers | C23C 2/26 428/653 |
| 2012/0233903 A1 | 9/2012 | Sietsema | |
| 2013/0171471 A1 * | 7/2013 | Bullard | B05D 3/0254 428/683 |

FOREIGN PATENT DOCUMENTS

| | | | | |
|---|---|---|---|---|
| DE | 102011008787 A1 | | 7/2012 | |
| EP | 0192333 | * | 8/1986 | ............. A47J 36/02 |
| JP | 860326 A | | 3/1996 | |
| JP | 08060326 | * | 3/1996 | ............. C23C 2/26 |
| WO | 03053682 A1 | | 7/2000 | |
| WO | 2012030726 A1 | | 3/2012 | |

* cited by examiner

SURFACE-COATED STEEL SHEET AND PROCESS FOR THE PRODUCTION THEREOF

CROSS-REFERENCE TO RELATED APPLICATIONS

This application is the United States national phase of International Application No. PCT/EP2013/074669 filed Nov. 26, 2013, and claims priority to German Patent Application No. 10 2012 112 109.5 filed Dec. 11, 2012, the disclosures of which are hereby incorporated in their entirety by reference.

BACKGROUND OF THE INVENTION

Field of the Invention

The invention relates to a surface-coated steel sheet composed of carbon steel and having a coating which is made up of at least one metallic corrosion protection layer and at least one further layer applied to the metallic corrosion protection layer, for example by a material bond. The invention further relates to a process for producing a surface-coated steel sheet, in which at least one metallic corrosion protection layer is applied material bonded to a sheet-like product composed of carbon steel and at least one further layer is applied material bonded to the at least one metallic corrosion protection layer.

Description of Related Art

Owing to poor corrosion resistance, uncoated carbon steels are usually protected against corrosion by means of zinc coating. For aesthetic reasons, an often multilayer, color-imparting organic surface coating is subsequently applied and this increases the corrosion resistance further. However, the chemical substances present in the surface coating systems and primers in order to ensure corrosion protection and adhesion of the surface coating are sometimes hazardous to health and the environment since they frequently comprise heavy metals such as nickel, chromium6 and chromium3.

In addition, color-imparting organic surface coatings suffer from the problem that they become bleached more or less quickly when exposed to intense UV light.

As an alternative to zinc-coated carbon steel sheets, there are also nonrusting stainless steel and copper sheets available, but these are relatively expensive. In general, stainless steel in particular is a relatively expensive material because of its metallic alloying elements such as chromium, titanium and nickel.

WO 2012/030726 A1 describes a zinc-coated steel sheet composed of carbon steel which is intended to imitate a nonrusting stainless steel sheet. For this purpose, the zinc layer of the steel sheet is pressed and textured, with the texture having a surface roughness in the range from 0.127 to 1.524 μm (=5 to 60 microinches). The zinc-plated and textured carbon steel sheet additionally has an organic coating which represents additional corrosion protection and by means of which the appearance of the metal sheet can be varied in accordance with its end use. The organic coating can consist of a transparent polyester film which has, in particular, an anti-fingerprint function. However, this zinc-coated and textured steel sheet is rather unsatisfactory in respect of its aesthetic effect.

SUMMARY OF THE INVENTION

It is an object of the present invention to provide a steel sheet of the type mentioned at the outset which offers without a color-imparting organic surface coating a high-quality impression in respect of its aesthetic effect and additionally has a very high UV resistance.

The steel sheet of the invention is made of carbon steel and provided with a coating which is made up of at least one metallic corrosion protection layer and at least one further layer applied material bonded to the metallic corrosion protection layer, wherein the at least one further layer is a metallic layer or is formed from a metallic layer and the metallic layer is based on nonrusting stainless steel, a chromium- and/or nickel-containing alloy, copper and/or a copper alloy.

The process of the invention is accordingly characterized in that at least one metallic corrosion protection layer is applied to a sheet-like product composed of carbon steel and at least one metallic layer is applied material bonded as further layer to the corrosion protection layer, where the metallic layer is based on nonrusting stainless steel, a chromium- and/or nickel-containing alloy, copper and/or a copper alloy.

The advantages of the present invention are the color or aesthetic effect produced by the further metallic layer. As a result, complicated surface coating systems, which frequently contain substances which are harmful to the environment and to health, can be dispensed with and at the same time a very high UV resistance can be achieved. In particular, sheet-like material which looks like a conventional single-layer, nonrusting stainless steel sheet or copper sheet and is suitable for a wide range of uses, e.g. in building and construction, vehicle construction, shipbuilding, in the furniture industry, domestic appliance industry and/or entertainment electronics, can be provided by application of nonrusting stainless steel, copper, or chromium-, nickel- and/or copper-containing alloys to the carbon steel sheet provided with at least one metallic corrosion protection layer. For example, cladding elements for exterior walls of buildings, railings, coverings, shuttering elements, kitchen appliances, housings of kitchen appliances, vapor extraction hood housings, sanitary appliances, decorative parts and also housings and casings having a design requirement can be produced from the surface-coated steel sheet of the invention. For example, a brass or bronze layer can be produced on a zinc-coated carbon steel sheet by application according to the invention of a copper alloy. Compared to a corresponding stainless steel or copper sheet, i.e. a single-layer sheet made of nonrusting stainless steel or copper, the steel sheet of the invention offers not only a cost advantage but possibly also improved mechanical stability due to the steel sheet functioning as support. In addition, the at least one metallic corrosion protection layer, in particular, guarantees high corrosion resistance of the steel sheet of the invention. Addition of tin (Sn) or application of a tin-containing copper alloy makes it possible to achieve a highly corrosion-resistant bronze alloy as further metallic layer on the metallic corrosion layer.

The thickness of the sheet made of carbon steel is, for example, in the range from 0.05 to 30 mm, preferably in the range from 0.5 to 5 mm.

The at least one metallic corrosion protection layer of the steel sheet of the invention is preferably a corrosion protection layer based on zinc and/or aluminum, e.g. a corrosion protection layer of the Z (Zinc), ZE (electrolytic zinc), ZA (Zinc-Aluminum), AZ (Aluminum-zinc), FAL (hot-dip aluminised) or ZM (Zinc-magnesium) type. The corrosion protection layer is applied to the sheet made of carbon steel by means of a melt dipping process or an electrolytic process. It ensures at least corrosion protection of one or both sides (broad sides) of the steel sheet. However, corrosion protection of the steel sheet of the invention can preferably also extend to the (cut) edges, which can be realized, in particular, in the case of zinc-based coatings.

The at least one metallic layer is preferably applied by chemical or physical vapor deposition to the metallic corrosion protection layer. Deposition is preferably carried out under reduced pressure, under inert gas (e.g. argon) or in a reactive atmosphere (e.g. oxygen or air), with a metal, metal oxide, metal carbide and/or metal nitride layer being deposited on the metallic corrosion protection layer. The metallic layer applied to the corrosion protection layer can also have a multilayer configuration. The at least one metallic layer is preferably applied in a thickness in the range from 1 nm to 10 μm, particularly preferably in a thickness in the range from 50 to 200 nm, to the metallic corrosion protection layer.

Physical deposition from the gas phase can be carried out under vacuum conditions and/or with addition of the inert gas, preferably argon, in the process of the invention. Chemical vapor deposition, on the other hand, is carried out under a reactive atmosphere, for example under oxidative conditions resulting from addition of oxygen or air. In this way, deposition of one or more metal oxide layers on the corrosion protection layer can be effected. This can be advantageous in respect of the corrosion resistance of the coated materials, in particular in respect of the electrochemical series of the participating metals and compounds, in particular when zinc and stainless steel are present.

A further preferred embodiment of the invention is characterized in that the at least one metallic corrosion protection layer is textured before application of the at least one further metallic layer. Texturing is carried out in a macroscopic and/or microscopic range, for example by embossing of patterns, dressing, brushing or the like. After texturing, the at least one further metallic layer is then applied. The texturing can improve or enhance the desired optical effects. For example, particular patterns or the impression of a brushed stainless steel or copper sheet can be produced in this way.

A further preferred embodiment of the invention comprises applying at least one transparent layer to the at least one further metallic layer. In the present context, the term transparent layer encompasses a semitransparent layer, in particular a see-through colored layer, e.g. a transparent layer which gives stainless steel produces a slight blue cast or a slight red cast as design effect. The transparent layer can be, in particular, a clear varnish or an anti-fingerprint coating based on, for example, organic coating material. In addition, corrosion protection of the steel sheet of the invention can be improved further by this optional transparent (or semitransparent) layer.

BRIEF DESCRIPTION OF THE DRAWINGS

The invention is illustrated below with the aid of a drawing showing a number of illustrative embodiments. The drawing schematically shows.

Figure 1:
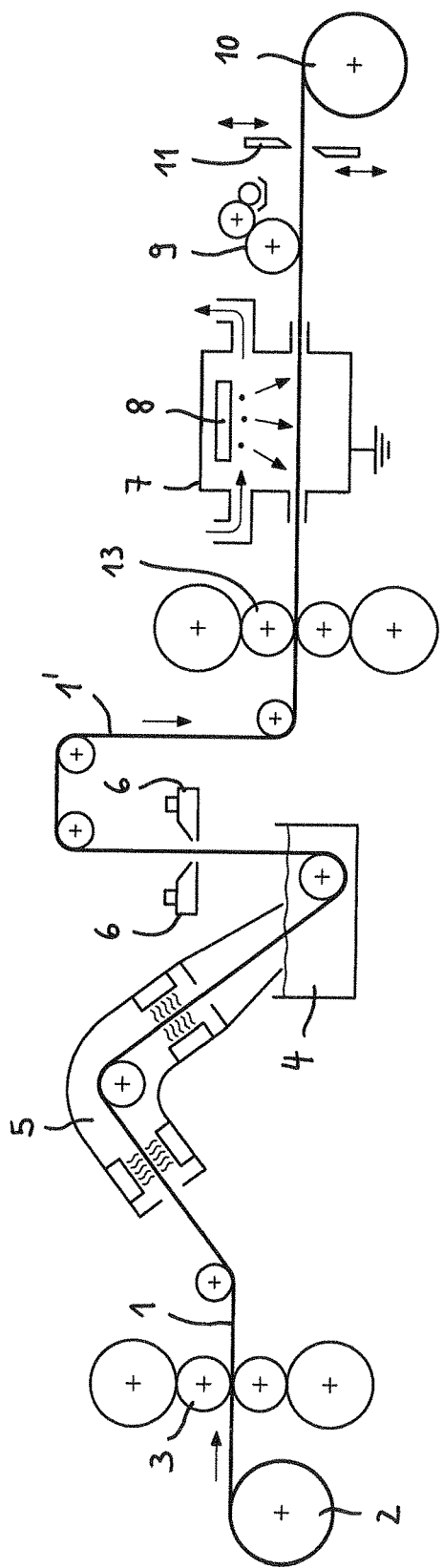
FIG. 1 a plant for carrying out the process of the invention.

A system for the surface-coating of steel sheet composed of carbon steel (C steel) is outlined in FIG. 1. The sheet-like product 1 composed of C steel to be coated according to the invention has, for example, the following chemical composition:
C 0.12-0.65% by weight,
Si max. 0.40% by weight,
Mn 0.30-0.90% by weight,
P max. 0.025% by weight,
S max. 0.010% by weight,
Cr max. 0.40% by weight,
Mo max. 0.10% by weight and
Ni max. 0.40% by weight.

DESCRIPTION OF THE INVENTION

The carbon steel is preferably fed as coil 2 to the plant. The thickness of the strip-like C steel 1 is, for example, in the range from 0.05 mm to 30 mm. The strip-like C steel sheet 1 undergoes, after the hot and/or cold rolling 3, a first surface coating which serves for corrosion protection of the broad faces and, depending on the coating system, also the edges of the steel strip 1. This surface coating or zinc coating can be, for example, fire galvanizing (Z), electrolytic zinc coating (ZE), zinc-aluminum coating (ZA), aluminum-zinc coating (AZ), fire aluminum coating (FAL) or zinc-magnesium coating (ZM).

The steel strip 1 is preferably zinc-coated or provided with a corrosion protection coating on both sides in a hot dipping facility 4. The steel strip 1 is heated beforehand in a tunnel oven 5. 6 denotes stripping devices, for example blow nozzles, by means of which excess corrosion protection material or zinc-coating material is removed from the steel strip 1 and the desired thickness of the metallic corrosion protection layer is set.

At least one further metallic layer is subsequently applied to at least one side of the steel strip 1' provided with the metallic corrosion protection layer by means of a second surface-coating process, with this metallic layer being based on nonrusting stainless steel, copper, a chromium- or nickel-containing alloy and/or a copper alloy. The at least one further metallic layer is preferably applied to the corrosion protected steel strip by physical vapor deposition (PVD) or chemical vapor deposition (CVD). The layer thickness is in the range from 1 nm to 10 μm, preferably in the range from 50 to 200 nm. The additional metallic layer can also be applied in a number of sublayers to the corrosion protection layer. The apparatus for applying the relatively thin further metallic layer or for carrying out the vapor deposition is denoted by the reference numeral 7 in FIG. 1.

The vapor deposition of the thin further metallic layer is preferably carried out under vacuum conditions or with the introduction of inert gas, preferably argon. Here, the metal to be applied to the corrosion protection layer is converted into a gaseous state and condensed on the corrosion protection layer. To covert the metal into the gaseous state, it is, for example, heated until it vaporizes at a suitable vaporization rate. In order to apply a high-quality and very homogeneous metal layer to the corrosion protection layer, it is advantageous for the space between the vaporizer and the substrate 1' to be coated to be as free as possible of material, for which reason the deposition is preferably carried out under vacuum conditions. In addition to or as an alternative to the use of a thermally acting vaporizer, the metal to be applied to the corrosion protection layer can also be brought into the gas phase by ion bombardment. In this physical coating process (also referred to as sputtering deposition), particles on the surface of a body 8 providing the metal to be applied, referred to as the target, are atomized by ion bombardment and thereby ablated from the surface of the body. The gaseous metal formed in this way is subsequently conveyed onto the steel sheet 1' which has already been coated with a corrosion protection layer and is to be coated and condensed there.

As an alternative to operation under reduced pressure, the vapor deposition of metal oxide layers can also be carried out under a reactive atmosphere, in particular under oxidative conditions with introduction of oxygen or air. This enables an advantage to be achieved in respect of the corrosion resistance of the coated C steel, especially in respect of the electrochemical series of the participating metals and compounds, in particular in the presence of zinc and stainless steel.

In one of the abovementioned ways, the steel sheet 1' which has been coated with a corrosion protection layer is, according to the invention, provided with at least one additional metal, metal oxide, metal carbide and/or metal nitride layer which gives the steel sheet 1' a high-quality appearance, for example an appearance similar to stainless steel.

As additional corrosion protection, at least one transparent layer can subsequently be applied. This transparent layer is preferably formed from an organic coating material, for example a clear varnish. The transparent layer can also perform an anti-fingerprint function in addition to the additional corrosion protection function. The application of the at least one transparent layer is, for example, effected by means of paint transfer rollers 9 or spray nozzles. In addition, the transparent layer can also have a slight color shade, for example, have a slight blue, red, green or yellow cast, so that it optionally also has a design function.

After production or deposition of the at least one further metallic layer and the optional application of the at least one transparent layer, the surface-coated steel strip is wound up to form a coil 10 or cut by means of a cutting device 11 into a plurality of plates 12 having a particular length.

In a preferred embodiment of the invention, a further metallic layer composed of nonrusting stainless steel is applied to the metallic corrosion protection layer of the sheet-like product made of C steel. This can be effected, for example, by physical vapor deposition using suitable stainless steel (e.g. of the alloy type 1.4301) as target 8. As an alternative or in addition, it is also possible to use chromium- and/or nickel-containing alloys, known as nickel-base alloys, for example nickel-copper, nickel-iron, nickel-iron-chromium, nickel-chromium, nickel-molybdenum, nickel-chromium-cobalt and/or low-alloyed nickel alloys as targets 8 in the physical vapor deposition to form the at least one further metallic layer. When such a target 8 is used, the C steel sheet 1' which has been coated with a corrosion protection layer is given the appearance of a nonrusting stainless steel sheet or an appearance similar to stainless steel.

In another preferred embodiment of the invention, a further metallic layer composed of copper or a copper alloy is applied by means of vapor deposition to the metallic corrosion protection layer of the C steel substrate 1'. Decorative copper, brass or bronze layers are produced by the use of copper or copper alloys. Use of a copper alloy containing tin (Sn) enables a highly corrosion-resistant bronze alloy to be deposited on the surface of the metallic corrosion protection layer of the C steel substrate 1'.

After application of the corrosion protection layer, the surface of the coated steel sheet 1' can be additionally textured in a macroscopic and/or microscopic range in the form of embossing, patterns, etc. For example, at least one dressing roller 13 and/or brush device is used for this purpose. The optional additional texturing enables the optical impression of the steel sheet of the invention to be improved; for example the optical impression of a brushed stainless steel sheet can be imitated particularly closely.

Figure 2:
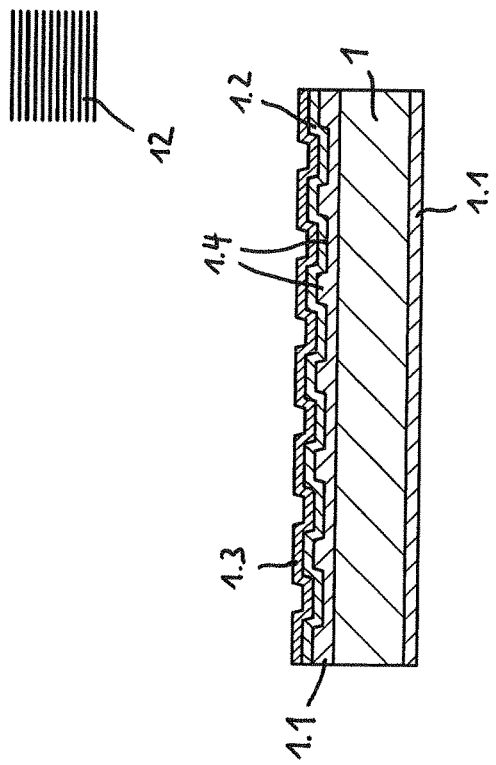
FIG. 2 a section of a surface-coated steel sheet according to the invention, in cross-sectional view.

FIG. 2 shows a section of a steel sheet according to the invention which has a support layer 1 made of C steel which is provided on both sides with a metallic corrosion protection layer 1.1. The thickness of the support layer 1 is, for example, in the range from 0.05 to 30 mm, in particular in the range from 0.1 to 3 mm. The corrosion protection layer 1.1 is preferably a metal layer based on zinc and/or aluminum. A further metallic layer 1.2 is applied to at least one of the corrosion protection layers 1.1, for example by a material bond. The metallic layer 1.2 is based on nonrusting stainless steel, copper, a chromium- and/or nickel-containing alloy and/or a copper alloy. The metallic layer 1.2 is relatively thin; its thickness is in the range from about 1 nm to 10.mu.m, preferably in the range from 50 to 200 nm. The metallic layer 1.2 is optionally provided with a transparent, organic layer 1.3, e.g. a clear varnish, a slightly colored, transparent layer or an anti-fingerprint coating.

Figure 3:
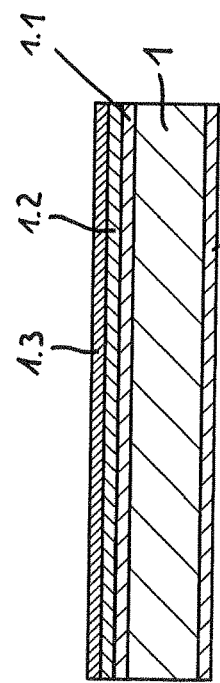
FIG. 3 a section of a surface-coated steel sheet as per a further illustrative embodiment of the invention, likewise in cross-sectional view.

The illustrative embodiment of the steel sheet of the invention shown in FIG. 3 differs from the illustrative embodiment shown in FIG. 2 in that the corrosion protection layer 1.1 has been provided with a surface texture in the form of embossing or small raised regions 1.4 before application of the further metallic layer 1.2 and the optional transparent layer 1.3. The surface texture is also reproduced in the metallic layer 1.2 and the optional transparent layer 1.3.

However, the transparent layer 1.3 can also be applied as clear varnish or semitransparent colored coating to the structured metallic layer 1.2 in such a way that the latter finally has an essentially flat or smooth surface. The structure is then present essentially only within the coating. In this case, the finished surface-coated steel sheet thus has an essentially flat or smooth surface on its side facing the texturing, which is advantageous from the point of view of avoiding dirt deposits on the steel sheet.

The invention is not restricted to the illustrative embodiments shown in the drawing. Rather, it is possible to conceive of numerous variants which make use of the invention specified in the attached claims even in a configuration deviating from the illustrative embodiments presented. Thus the carbon steel sheet 1 of the invention can, for example, also be coated on both sides with a layer 1.2 composed of nonrusting stainless steel, copper, a chromium- and/or nickel-containing alloy and/or copper alloy.

The invention claimed is:

1. A surface-coated steel sheet comprising carbon steel and a coating which is made up of at least one metallic corrosion protection layer and at least one further layer,
    wherein the at least one metallic corrosion protection layer is applied to the carbon steel and the at least one further layer is applied to the metallic corrosion protection layer,
    wherein the at least one further layer is a metallic layer,
    wherein the metallic layer is at least one of nonrusting stainless steel; a nickel-based alloy that may also contain chromium; copper; and/or a copper alloy, wherein the at least one metallic corrosion protection layer is textured, and wherein the at least one further metallic layer is applied by chemical or physical vapor deposition to the metallic corrosion protection layer.

2. The surface-coated steel sheet as claimed in claim 1, wherein the at least one further metallic layer has a thickness in the range from 1 nm to 10 μm.

3. The surface-coated steel sheet as claimed in claim 1, further comprising at least one transparent layer applied to the at least one further metallic layer.

4. The surface-coated steel sheet as claimed in claim 1, wherein the at least one metallic corrosion protection layer is a corrosion protection layer based on zinc and/or aluminum.

5. The surface-coated steel sheet as claimed in claim 1, wherein the at least one metallic corrosion protection layer is applied to the steel sheet by a hot dipping process or an electrolytic process.

6. The surface-coated steel sheet as claimed in claim 1, wherein the at least one further metallic layer has a thickness from 50 to 200 nm.

\* \* \* \* \*